United States Patent
Tabuchi et al.

Patent Number: 5,330,053
Date of Patent: Jul. 19, 1994

[54] CASE FOR PHOTOMASK

[75] Inventors: Kazuhiro Tabuchi; Hiroyuki Inomata; Takashi Yamauchi, all of Tokyo, Japan

[73] Assignee: Dai Nippon Printing Co., Ltd., Tokyo, Japan

[21] Appl. No.: 88,861

[22] Filed: Jul. 7, 1993

Related U.S. Application Data

[63] Continuation-in-part of Ser. No. 831,903, Feb. 6, 1992, abandoned.

[30] Foreign Application Priority Data

Feb. 7, 1991 [JP] Japan ................... 3-4455

[51] Int. Cl.$^5$ .................................... B65D 85/48
[52] U.S. Cl. ............................... 206/455; 206/454; 206/594
[58] Field of Search ............... 206/334, 454, 455, 523, 206/594; 378/182, 188

[56] References Cited

U.S. PATENT DOCUMENTS

| | | | |
|---|---|---|---|
| 2,327,713 | 8/1943 | Hunter | 206/455 |
| 3,768,393 | 10/1973 | Betz et al. | 206/455 |
| 3,792,771 | 2/1974 | Bonjean | 206/455 |
| 3,948,436 | 4/1976 | Bambara | 206/523 |
| 4,470,508 | 9/1984 | Yen | 206/334 |
| 4,511,038 | 4/1985 | Miller et al. | 206/454 |
| 4,574,950 | 3/1986 | Koe et al. | 206/334 |
| 4,700,844 | 10/1987 | Griffith | 206/523 |
| 4,830,182 | 5/1989 | Nakazato et al. | 206/334 |
| 4,899,880 | 2/1990 | Carter | 206/454 |

FOREIGN PATENT DOCUMENTS

| | | | |
|---|---|---|---|
| 63-179355 | 7/1988 | Japan | 206/455 |
| 6613821 | 4/1968 | Netherlands | 206/455 |

Primary Examiner—David T. Fidei
Attorney, Agent, or Firm—Dellett and Walters

[57] ABSTRACT

The present invention relates to a case for a photomask to prevent generation of dust which might attach to and stain a photomask or the photomask pellicle. In a case for a photomask comprising a case main unit with an upper opening for accommodating the photomask and a lid for the opening of the case main unit, cushion materials are provided on the inner bottom of the case main unit and on the inner ceiling of the lid. The photomask is elastically squeezed between the cushion materials when accommodated. Thus, shaking and rattling during transportation are prevented to minimize the generation of dust. As the cushion material, a rubber material having a smooth surface on one side and a coarse surface on the other side is used.

6 Claims, 3 Drawing Sheets

10 Photomask
11 Pellicle

10 Photomask
11 Pellicle

CASE FOR PHOTOMASK

This is a continuation-in-part of copending patent application Ser. No. 07/831,903 filed on Feb. 6, 1992, now abandoned.

BACKGROUND OF THE INVENTION

The present invention relates to a case for accommodating and transporting a photomask or a substrate for a photomask (hereinafter simply referred to as "photomask") to be used in the photolithography process for the manufacture of semiconductor devices such as LSI, ultra LSI, etc.

In the past, a photomask was accommodated directly in a case or accommodated and transported in a case using a buffer material of a polyvinyl chloride bag inflated by gas or a polyvinyl chloride bag containing sponge. Further, the photomask accommodated in a case was pressed down by providing a cushion material such as sponge within the upper lid of the case. As such cushion material, a material containing a moisture-resistant substance such as silica gel has been used due to differences in rinsing method of photomask or in sealing property of the case.

However, when the photomask is accommodated directly in a case, there is a free space between the case and the photomask which permits shaking or rattling during movement, and accordingly dust is generated during transportation. As a result, the photomask or a pellicle membrane covering the photomask (hereinafter referred to as "photomask pellicle") is contaminated. When the photomask is accommodated in a case using a polyvinyl chloride bag inflated by gas or a polyvinyl chloride bag as a buffer material containing a material such as sponge, the bag may be broken by impact during transport or foreign objects may spread in the bag. Further, when the case is opened, the polyvinyl chloride bag may not be held integrally with the upper lid of the case and may fall onto the photomask which is exposed at the upper portion of the case. As a result, a flaw or stain may be caused on the surface of the photomask or the photomask pellicle because of an inadequate seal between the upper lid and the polyvinyl chloride bag.

Also, when a cushion material such as sponge is provided, shaking of the photomask during transportation cannot be perfectly prevented because the cushion material is provided only in the upper lid of the case and it is in contact only with one side of the photomask, and similar problems occur due to dusting from the portions between the case bottom or case side and the photomask. Again, problems result when the cushion material falls out of the lid when the upper lid is opened or closed.

SUMMARY OF THE INVENTION

To solve the above problems of conventional technique, it is an object of the present invention to provide a case for a photomask using cushion materials which do not generate dust or gas in the case and which do not fall even when the upper lid is opened or closed, and characterized in that said cushion materials are furnished between the case and the photomask to prevent shaking or rattling and to minimize the generation of dust and the like to attach and stain the photomask or photomask pellicle.

The case for a photomask according to the present invention comprises a case main unit with an upper opening for accommodating the photomask or a photomask substrate and a lid for the opening of the case main unit, and it is characterized in that cushion materials are provided on the inner bottom of the case main unit and on the inner ceiling of the lid, and the photomask or the photomask substrate is elastically squeezed between the cushion materials.

In this case, as the cushion materials, it is preferable to use rubber material, which possesses elasticity in itself and which does not cause changes such as stains, blur, etc. on the photomask, photomask substrate and photomask pellicle, and silicone rubber or fluoro-rubber are suitable for this purpose. Further, it is also preferable to smooth the surface of the cushion material on the inner ceiling of the lid facing the internal surface of the lid and to coarsen the surface touching the photomask or the photomask substrate, or to attach a single-sided adhesive tape made of a material not adherent to glass on its surface in order to prevent the falling of the cushion materials when the lid is opened or closed.

In the present invention, cushion materials are provided on the inner bottom of the case main unit and inner ceiling of the lid to accommodate the photomask and the photomask substrate by squeezing them between the cushion materials. This makes it possible to prevent the adhesion of dust and staining of the photomask and the photomask pellicle due to shaking and rattling between the case and the photomask during transportation.

Still other objects and advantages of the invention will in part be obvious and will in part be apparent from the specification.

The invention accordingly comprises the features of construction, combinations of elements and arrangements of parts which will be exemplified in the construction hereinafter set forth, and the scope of the invention will be indicated in the claims.

DESCRIPTION OF THE PREFERRED EMBODIMENT

Figure 1:
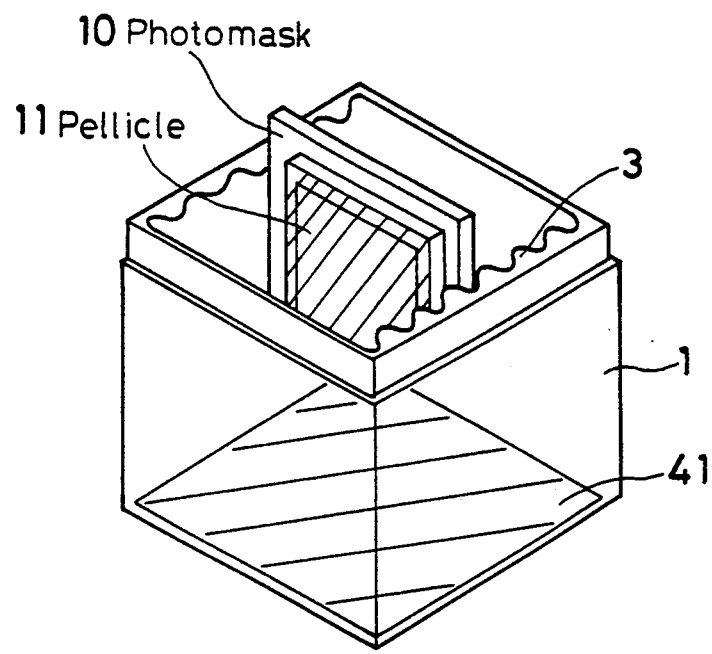
FIG. 1 is a perspective view of an embodiment of the present invention showing a photomask inserted into grooves of a case main unit.
Figure 2:
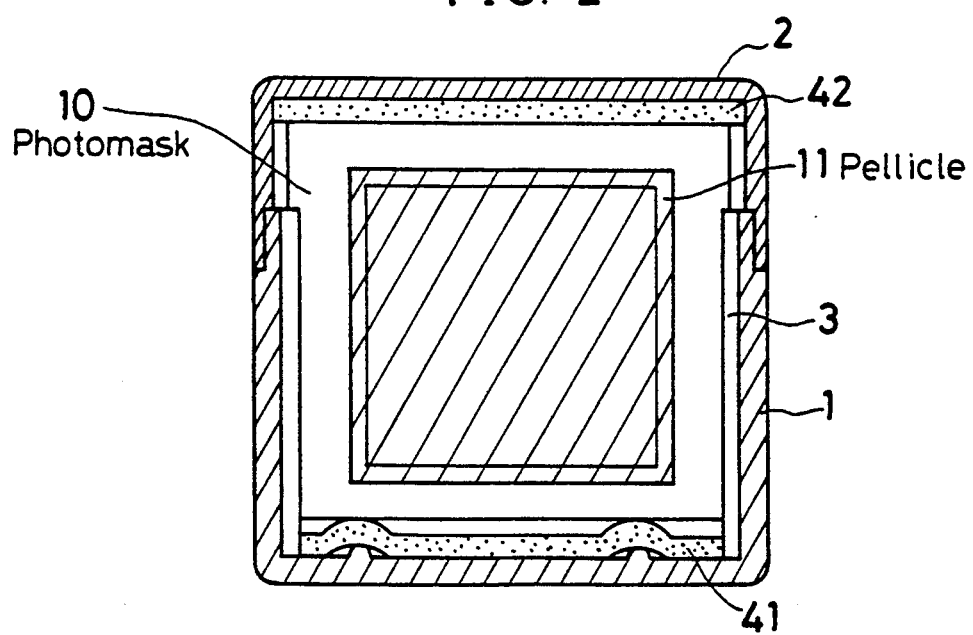
FIG. 2 is a longitudinal cross-sectional view of the case main unit of FIG. 1 covered with an upper lid.
Figure 3:
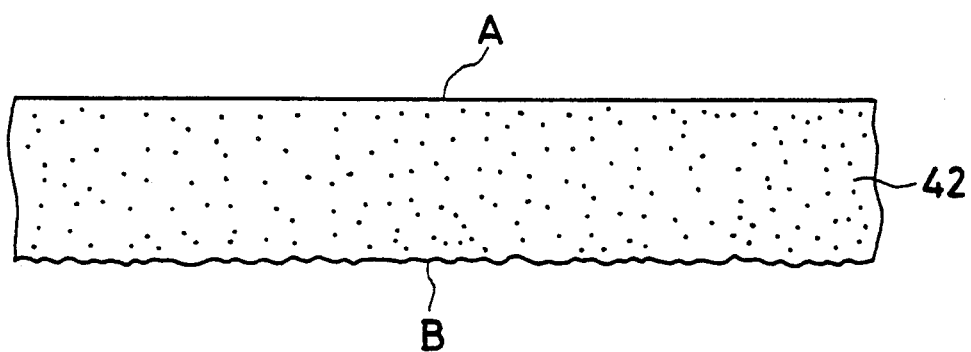
FIG. 3 is a cross-sectional view of a cushion material.

In the following, description will be given on an embodiment of a case for a photomask according to the present invention, referring to the attached drawings. FIG. 1 is a perspective view showing a photomask 10 with a pellicle 11 inserted into grooves of a case main unit 1 from above, and FIG. 2 is a longitudinal cross-sectional view of the case main unit 1 of FIG. 1 covered with an upper lid 2. The shapes of the case main unit 1 and the upper lid 2 are the same as those of a conventional type case. On inner surfaces opposing each other of the case main unit 1, partitions 3 are provided to form grooves into which the photomask 10 is to be inserted.

On the inner bottom of the case main unit 1 and on the inner ceiling of upper lid 2, cushion materials 41 and 42 are provided, and a photomask 10 is accommodated between them as if squeezed therebetween. As a result, shaking and rattling of the photomask 10 during transportation are minimized and the generation of dust due to such shaking is prevented. As cushion materials 41 and 42, materials such as silicone rubber, fluoro-rubber, etc. are used, which have elasticity in themselves, do not require cushion effect by gas such as air and do not generate dust or gas due to breaking of air bubbles. Such rubber material does not cause changes such as stain, blur, etc. on the photomask and the photomask pellicle and should be resistant to repeated washing. The cushion materials 41 and 42 must be such that they can easily be removed from the case main unit 1 and upper lid 2 and can be washed whenever stained.

Figure 4:
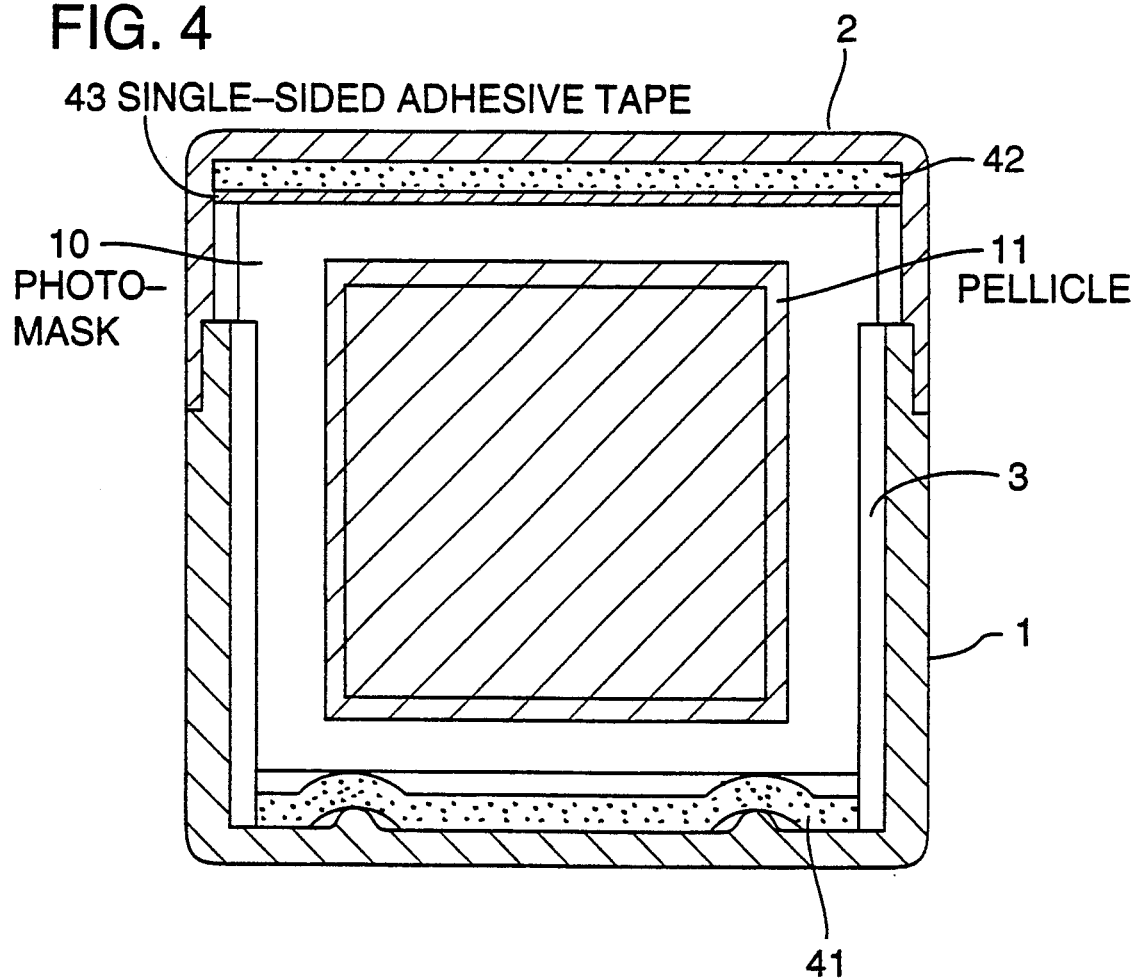
FIG. 4 is a view similar to FIG. 2 of another embodiment of the invention.

The cushion materials 41 and 42, and in particular the cushion material 42, have a smooth surface A contacting inner surface of the upper lid 2 and a coarse surface B in touch with a side of the photomask 10. With such an arrangement, the cushion material 42 is closely fitted to the upper lid 2 of the case, and they are not easily separated by their own weight. On the other hand, the cushion material 42 comes into contact with the photomask 10 through the coarse surface B. Thus, it is difficult to closely fit it with the photomask 10, and it can easily be separated from the photomask. Therefore, when the upper lid 2 is opened, the cushion material 42 is prevented from falling onto the photomask 10 exposed from the case main unit 1 as it is separated from the inner surface. As a result, the cushion material 42 is prevented from contacting working surfaces of the photomask and the photomask pellicle, which may be stained by such contact. When all sides of the cushion material 42 are smooth, or when it is made of such materials that it is closely fitted to the photomask substrate glass, as shown in FIG. 4, a single-sided adhesive tape 43 is attached via the adhesive side of the tape on a side of the cushion material 42 contacting the photomask 10. The tape is made of a material such that the non-adhesive side of the tape is not adherent to glass. Thus, the tape prevents the cushion material 42 from adhering to the photomask 10 or falling on it. As the material of the single-sided adhesive tape 43, polyester, Teflon (trademark) tape, cellophane tape, etc. may be used. Also, for the cushion material 41 placed with the case main unit 1, it is preferable to provide smooth surface on the side facing the inner surface and coarse surface on the side touching a side of the photomask 10.

As the case main unit 1 and the upper lid 2, BAYON (trade name; Kureha Chemical Industry Co., Ltd.) having such structure that rubber particles with lower electrical resistance are dispersed in hard resin (matrix). A case made of this material does not show a decrease in charge preventive effect even when washed. If the case is made of such plastics, it is designed as colorless see-through, red see-through or blue see-through. When it is colored in red see-through, the case can also be used for a resist-coated photomask substrate because of its selectivity of optical wavelength.

A sealing tape made of polyethylene is used to seal between the case main unit 1 and the upper lid 2.

The case of photomask thus obtained does not generate dust during transportation or storage and has good sealing property, and temperature inside the case is kept at a constant level. Also, it can be used even after repeated washing.

In the above, description has been given on the case of photomask according to the present invention in connection with an embodiment, while the invention is not limited to the above embodiment, and many changes and modifications can be made without departing from the spirit or scope of the invention as set forth herein. This case can also be used for a photomask substrate.

As described above, in the case for a photomask according to the present invention, cushion materials are provided on the inner bottom of the case main unit and on the inner ceiling of the lid so that the photomask or the photomask substrate can be elastically squeezed between the cushion materials. As a result, it is possible to minimize shaking between the case and the photomask during transportation and to prevent the generation of dust, which may attach to and stain the photomask or the photomask pellicle.

Further, if rubber material having elasticity in itself and not to generate such changes as stain, blur, etc. on the photomask, the photomask substrate, and the photomask pellicle is used as the cushion material, no dust is generated from the cushion materials. By providing at least a smooth surface on the side of the cushion material facing the inner surface of the cushion material, which is placed on the inner ceiling of the lid, by providing coarse surface on the side of the cushion material which comes into contact with the photomask or the photomask substrate to be accommodated, or by attaching a single-sided adhesive tape made of a material not adherent to glass, it is possible to prevent the falling of the cushion material caused by opening or closing of the lid and to eliminate stain or flaw on the photomask or the photomask substrate.

We claim:

1. A case for a plate for use in a photolithographic process, comprising a case main unit having an upper opening for accommodating the plate, a lid for the opening of the case main unit, a lower cushion on an inner bottom of the case main unit, and an upper cushion removably disposed on an inner ceiling of the lid, whereby the plate is accommodated as elastically squeezed at opposite peripheral ends of the plate between the upper and lower cushions, wherein the upper cushion has a smooth surface on the side touching the inner surface of the lid and has a coarse surface on the side touching the accommodated plate, and the upper cushion is not adhered to the inner surface of the lid, wherein the upper and lower cushions are made of a rubber from the group consisting of a silicone rubber or a fluoro-rubber.

2. A case according to claim 1, for a photomask.

3. A case according to claim 1, for a photomask substrate.

4. A case for a plate for use in a photolithographic process, comprising a case main unit having an upper opening for accommodating the plate, a lid for the opening of the case main unit, a lower cushion on an inner bottom of the case main unit, and an upper cushion removably disposed on an inner ceiling of the lid, whereby the plate is accommodated as elastically squeezed at opposite peripheral ends of the plate between the upper and lower cushions, wherein the upper cushion has a smooth surface on the side touching the inner surface of the lid and a single-sided adhesive tape made of a material not adherent to glass is attached on the side of the upper cushion touching the accommodated plate, and the upper cushion is not adhered to the inner surface of the lid, and wherein the upper and lower cushions are made of a rubber from the group consisting of a silicone rubber or a fluoro-rubber.

5. A case according tot claim 4, for a photomask.

6. A case according to claim 4, for a photomask substrate.

* * * * *